(12) United States Patent
Hirano et al.

(10) Patent No.: US 6,284,440 B1
(45) Date of Patent: Sep. 4, 2001

(54) ALKALINE AQUEOUS SOLUTION AND METHOD FOR FORMING PATTERN OF PHOTOSENSITIVE RESIN COMPOSITION USING THE SAME

(75) Inventors: Takashi Hirano, Ebina; Toshio Banba, Utsunomiya, both of (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 0 days.

(21) Appl. No.: 09/623,372

(22) PCT Filed: Mar. 3, 1998

(86) PCT No.: PCT/JP98/00875

§ 371 Date: Sep. 1, 2000

§ 102(e) Date: Sep. 1, 2000

(87) PCT Pub. No.: WO99/45442

PCT Pub. Date: Sep. 10, 1999

(51) Int. Cl.$^7$ .......................................... G03F 7/32
(52) U.S. Cl. .......................... 430/331; 430/311; 430/493
(58) Field of Search ..................................... 430/331, 493

(56) References Cited

FOREIGN PATENT DOCUMENTS

| | | |
|---|---|---|
| 48-12242 B | 4/1973 | (JP) . |
| 56-30850 B | 7/1981 | (JP) . |
| 62-131263 A | 6/1987 | (JP) . |
| 64-60630 A | 3/1989 | (JP) . |
| 1-46862 B2 | 10/1989 | (JP) . |
| 3-104053A | 5/1991 | (JP) . |
| 4-258958 A | 9/1992 | (JP) . |
| 6-222567 A | 8/1994 | (JP) . |
| 8-202047 A | 8/1996 | (JP) . |

*Primary Examiner*—Hoa Van Le
(74) *Attorney, Agent, or Firm*—Smith, Gambrell & Russell, LLP

(57) ABSTRACT

The present invention provides a method for formation of a pattern of a photosensitive resin composition, which method is superior in sensitivity and film-thinning ratio, generates no scum in pattern formation, and gives a high resolution. That is, the present invention lies in a method for forming a pattern of a photosensitive resin composition, which comprises coating, on a substrate or the like, a positive photosensitive resin composition composed of a polyamide of particular structure and a diazoquinone compound, subjecting the resulting material to prebaking and then to light exposure, and dissolving and removing the exposed portions of the material with an aqueous alkaline solution containing an anionic surfactant and at least one kind of compound selected from compounds of calcium, strontium and barium, to obtain a pattern. The feature of the present invention lies particularly in using such an aqueous alkaline solution as a developing solution.

2 Claims, No Drawings

ALKALINE AQUEOUS SOLUTION AND METHOD FOR FORMING PATTERN OF PHOTOSENSITIVE RESIN COMPOSITION USING THE SAME

TECHNICAL FIELD

The present invention relates to a method for formation of a pattern of a photosensitive resin composition, which method leaves no scum in development and can form a pattern of high resolution.

BACKGROUND ART

In recent years, photosensitive resins such as photoresist, photosensitive polyimide and the like have been widely used in the semiconductor industry, for formation of IC or ultrafine circuits (e.g. LSI) or for the insulation film or protective film in a package to be processed. Photosensitive resins have a feature in that they can form a resin pattern of high precision by using a relatively simple apparatus. In particular, positive photoresists using a diazoquinone or the like as a photosensitive material and a phenolic novolac resin as a base, can form a pattern of excellent resolution because they cause no swelling during development. Further, the positive photoresists use an aqueous alkaline solution as the developing solution and accordingly are superior in safety. Owing to such various features, the positive photoresists are in wide use for production of the above-mentioned fine circuits of semiconductor device, etc. Also in the photosensitive heat-resistant resins (e.g. photosensitive polyimide) used for the insulating film or protective film of a semiconductor device, positive photosensitive heat-resistant resins having features such as high resolution, no environmental pollution of developing solution used, and the like have been developed similarly to the above photoresists (see, for example, JP-A-64-60630 and JP-B-1-46862) and are drawing attention as a resin for use in the insulating film or protective film of a highly integrated semiconductor device.

Most positive photosensitive resin compositions are formulated by combing an alkali-soluble polymer and the above-mentioned diazoquinone compound as a photosensitive material. The diazoquinone compound is insoluble in an aqueous alkaline solution at unexposed portions but, when subjected to light exposure, gives rise to chemical change and becomes soluble in the aqueous alkaline solution. Therefore, by utilizing the difference in solubility between exposed portions and unexposed portions and removing the exposed portions with an aqueous alkaline solution, a coating film pattern consisting of the unexposed portions alone can be formed.

The aqueous alkaline solution used as a developing solution is ordinarily an aqueous solution of tetramethylammonium hydroxide (hereinafter referred to as TMAH). A photoresist using an ordinary phenolic novolac resin as a base can be developed satisfactorily with this aqueous TMAH solution; however, in developing, for example, a photosensitive resin composition using, as a base, a polybenzoxazole precursor, as disclosed in JP-B-1-46862, scum of development remains at the exposed portions (though these portions need be dissolved and removed completely), which has given a low resolution.

As well known, there can be mentioned, as factors used for evaluation of a photosensitive resin, sensitivity (minimum exposure energy required for pattern formation), resolution (ultimate pattern fineness at which pattern formation is possible) and contrast (difference in solubility in a developing solution between exposed portions and unexposed portions). When attention is paid to the contrast, the base polymer contained in a positive photosensitive resin composition composed of an alkali-soluble polymer and as diazoquinone compound is soluble in an aqueous alkaline solution both before and after light exposure; therefore, even the polymer in the unexposed portions is dissolved during development. Consequently, in the development using a conventional alkali developing solution, the film thickness of unexposed portions has been decreased and no satisfactory contrast has been obtained. To alleviate this drawback, a method has been known which comprises adding a solubility-controlling agent (e.g. heterocyclic compound or cyclic acid anhydride) to a photosensitive resin composition to suppress the solubility of the resin in the resin composition (JP-B-48-12242 and JP-B-56-30850). This additive, however, remains in the resin after development. As a result, the additive has reduced the heat resistance, mechanical properties, etc. of the photosensitive resin, which has made difficult the use of the photosensitive resin in applications such as insulating film of a semiconductor device and the like.

Use of a developing solution for photosensitive resin as disclosed in JP-A-3-104053 can achieve an improved film-thinning ratio but has had a problem of reduction in sensitivity and resolution.

DISCLOSURE OF THE INVENTION

The present invention provides a method for formation of a pattern of a photosensitive resin composition, which method is superior in sensitivity and film-thinning ratio, generates no scum in pattern formation, and gives a high resolution.

That is, the present invention lies in:

(1) an aqueous alkaline solution containing an anionic surfactant and at least one kind of compound selected from compounds of calcium, strontium and barium, and (2) a method for forming a pattern of a photosensitive resin composition, which comprises coating, on a substrate or the like, a positive photosensitive resin composition composed of a polyamide represented by the following formula (1):

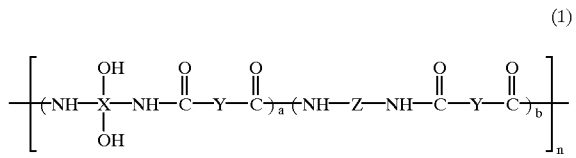

wherein X is a tetravalent aromatic group; Y is a bivalent aromatic group; and Z is

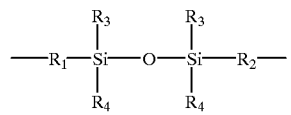

($R_1$ and $R_2$ are each a bivalent organic group, and $R_3$ and $R_4$ are each a monovalent organic group); a and b are each a mole fraction with the proviso that a+b=100 mole %, a=60.0 to 100 mole %, and b=0 to 40.0 mole %, and n=2 to 500, and a diazoquinone compound, subjecting the resulting material to prebaking and then to light exposure, and dissolving and removing the exposed portions of the material with an aqueous alkaline solution containing an anionic surfactant and at least one kind of compound selected from compounds of calcium, strontium and barium, to obtain a pattern.

DETAILED DESCRIPTION OF THE INVENTION

The polyamide of the formula (1) is composed of a bisaminophenol containing a structure of X and a silicone diamine containing a structure of Z as an optional component, and a dicarboxylic acid containing a structure of Y. This polyamide, when heated at about 300 to 400° C., gives rise to ring closure and changes to a polybenzoxazole which is a heat-resistant resin. Positive photosensitive resin compositions are developed generally with an aqueous alkaline solution. For example, a photoresist contains the phenolic hydroxyl group possessed by the phenolic novolac resin used as the base and, therefore, can be developed. Similarly, a positive photsensitive resin using a polyamide represented by the formula (1) as the base, can also be developed owing to the presence of phenolic hydroxyl group in the bisaminophenol containing a structure of X; however, the developability is inferior to that of the photoresist using a phenolic novolac resin as the base, scum generates at the exposed portions, and the resolution is inferior.

This is presumed to be because while one hydroxyl group is present relative to one benzene ring in the phenolic novolac resin, hydroxyl group is present only in the amine component in the polyamide represented by the formula (1). In, for example, a polyamide obtained by replacing a part of the bisaminophenol containing a structure of X, with a silicone diamine containing a structure of Z in the formula (1), for adhesivity improvement, the solubility is even lower; therefor, scum generates in a larger amount, and the resolution becomes very poor. In treating with an aqueous alkaline solution containing an aqueous alkaline solution containing an anionic surfactant, according to the present invention, however, no scum generates. The reason therefor is unclear, but is presumed to be that the anionic surfactant increases the affinity between resin and developing solution.

The X of the polyamide (1) of the present invention is, for example,

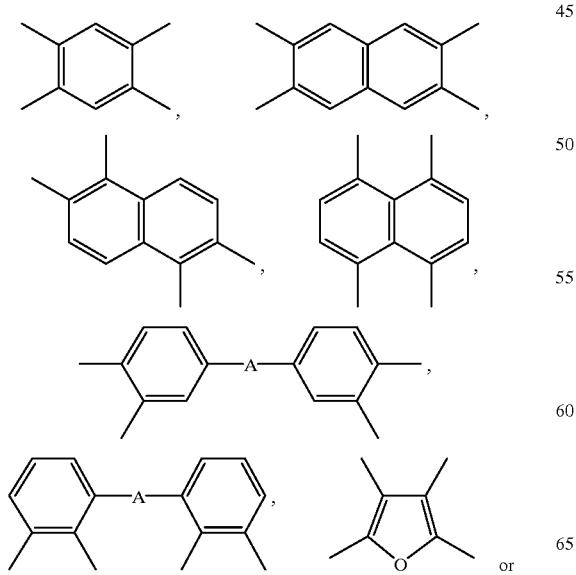

-continued

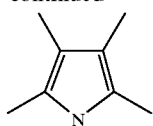

wherein A is —CH$_2$—, —O—, —S—, —SO$_2$—, —CO—, —NHCO— or —C(CF$_3$)$_2$—, but is not restricted thereto.

The Y of the formula (1) is, for example,

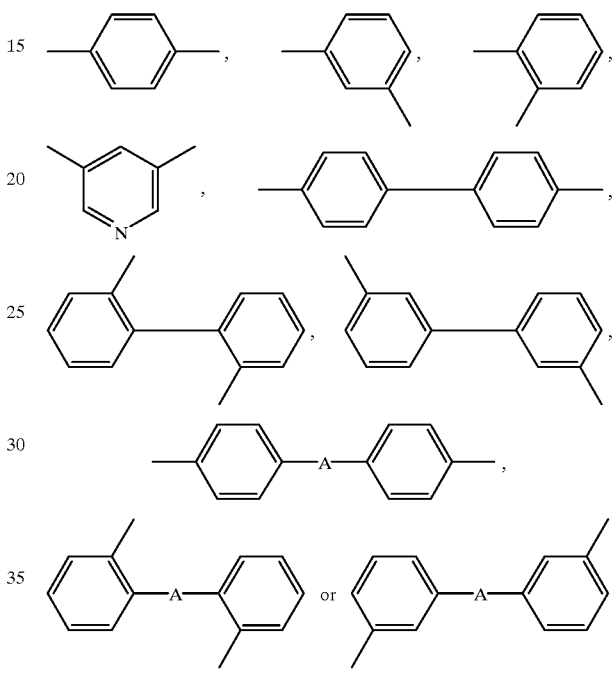

where A is —CH$_2$—, —O—, —S—, —SO$_2$—, —CO—, —NHCO— or —C(CF$_3$)$_2$—, but is not restricted thereto.

The Z of the formula (1) is, for example,

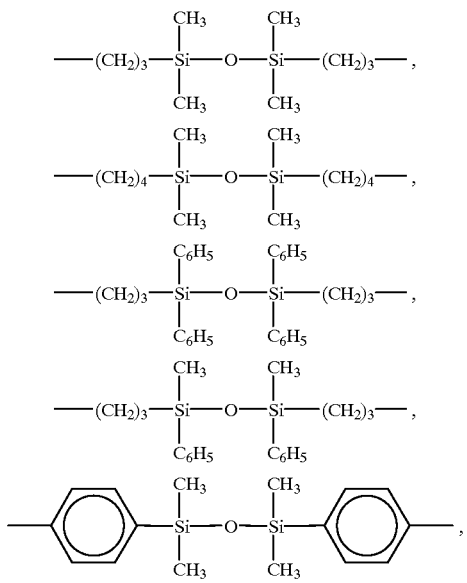

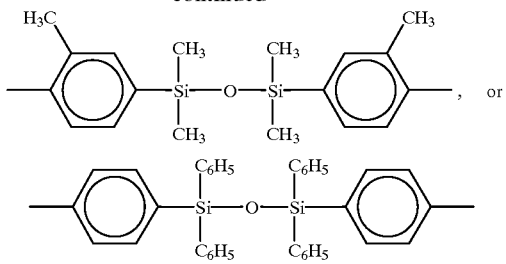

but is not restricted thereto.

The Z of the formula (1) is used when adhesivity is required to a substrate such as silicone wafer or the like. The use amount thereof, i.e. b can be up to 40.0 mole %. When the use amount exceeds 40.0 mole %, the solubility of resin is extremely low, scum generates even when the pattern formation method of the present invention is employed, and pattern formation is impossible.

Incidentally, the X, Y and Z may each be used singly or in admixture of two or more kinds.

Representatives of the anionic surfactant used in the present invention are alkylbenzenesulfonic acids, dioctyl sodium sulfosuccinate, sodium salt of 2-ethylhexyl sulfate, sodium acylmethyltaurate and lauryl 2-sodium-sulfosuccinate. Specific examples include dodecylbenzenesulfonic acid and sodium dodecylbenzenesulfonate, but are not restricted thereto.

The content of the anionic surfactant in the aqueous alkaline solution which is the developing solution of the present invention is preferably 0.1 to 10% by weight in the total aqueous alkaline solution. When the content is less than 0.1% by weight, scum generates easily; when the content is more than 10% by weight, the alkali concentration in the developing solution is low, resulting in low sensitivity.

A big feature of the present invention lies in that the aqueous alkaline solution contains at least one kind of compound selected from compounds of calcium, strontium and barium. Thereby, the significantly high contrast of the resin pattern formed after development has been made possible. The increase in contrast by the metal compound is caused by the fact that the metal compound greatly insolubilizes the resin film of, in particular, unexposed portions. The in-depth mechanism thereof is unclear yet but is presumed to be that a certain interaction probably occurs between the metal positive ion and the unexposed resin portions. As examples of the metal compound, there can be mentioned basic compounds such as calcium oxide, calcium hydroxide, strontium oxide, strontium hydroxide, barium oxide, barium hydroxide and the like; and inorganic or organic salts such as calcium chloride, calcium nitrate, calcium acetate, strontium chloride, strontium nitrate, strontium acetate, barium chloride, barium nitrate, barium acetate and the like. Needless to say, the metal compound is not restricted to the above compounds.

The content of the metal compound in the aqueous alkaline solution of the present invention differs depending upon the kind of the metal used, but is appropriately 0.1 to 1 ppm of the whole developing solution in terms of the content of the total metals. When the content is less than 0.1 ppm, the content of the metal compound is too low and no increase in contrast is obtained. When the content is more than 1 ppm, the solubilities of not only the unexposed portions but also the exposed portions decrease significantly, the sensitivity decreases, and also the resolution decreases.

The aqueous alkaline solution of the present invention dissolves and removes the alkali-soluble polymer and must be an aqueous solution having an alkali compound dissolved therein. As the alkali compound, there can be mentioned, for example, inorganic alkalis such as sodium hydroxide, potassium hydroxide, sodium carbonate, sodium silicate, sodium metasilicate, ammonia water and the like; primary amines such as ethylamine, n-propylamine and the like; secondary amines such as diethylamine, di-n-propylamine and the like; tertiary amines such as triethylamine, methyldiethylamine and the like; alcoholamines such as dimethylethanolamine, triethanolamine and the like; and quaternary ammonium salts such as tetramethylammonium hydroxide, tetraethylammonium hydroxide and the like.

The photosensitive resin composition used in the present invention contains a polyamide, a diazoquinone compound and a solvent as main components. If necessary, a polyamic acid may be added. Since the polyamic acid has carboxyl group, its addition invites increased solubility and a shorter development time.

The diazoquinone compound used in the present invention is a compound having a 1,2-benzoquinone diazide or 1,2-naphthoquinone diazide structure and is a substance known in U.S. Pat. Nos. 2,772,972, 2,797,213 and 3,669,658. There can be mentioned, for example,

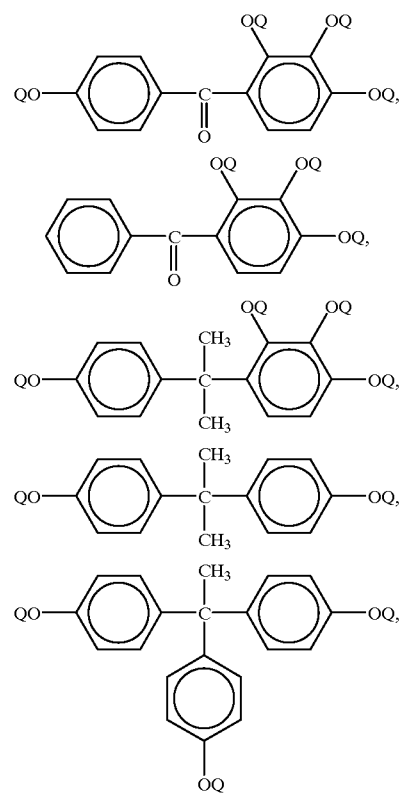

-continued

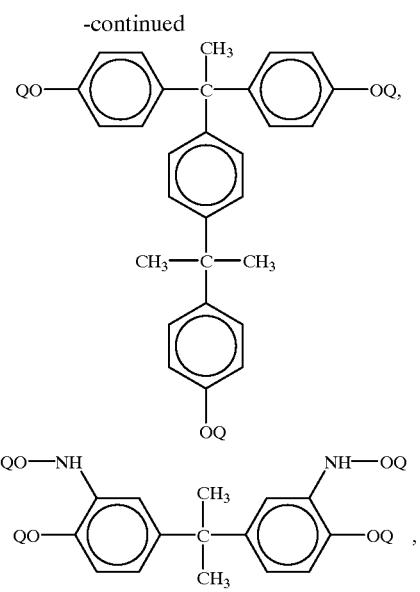

and

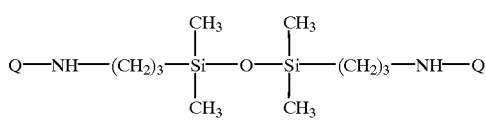

wherein Q is selected from hydrogen atom,

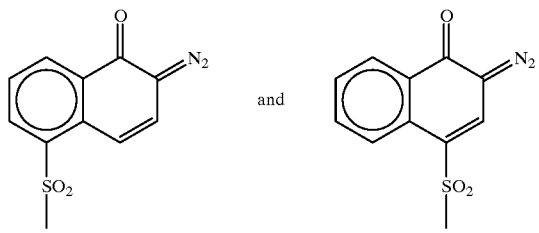

and, in each compound, at least one Q is

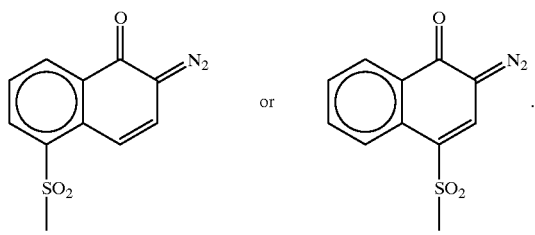

In pattern formation, first, the above composition is coated on an appropriate substrate, for example, a silicon wafer, a ceramic, an aluminum substrate or the like. The coating is conducted by spin coating using a spinner, spray coating using a spray coater, dipping, printing, roll coating, or the like. Then, the resulting coating film is dried at a temperature of about 60 to 180° C. The drying is conducted using an oven, an infrared oven, a hot plate or the like. Use of the hot plate is preferred from the standpoints of efficiency and easy temperature control. When the drying is conducted using the hot plate, drying at 80 to 130° C. is preferred. A temperature lower than 80° C. is not preferred because the drying is insufficient. A temperature higher than 130° C. is not preferred because the drying proceeds excessively. More preferred drying is 100 to 120° C. for 2 to 4 minutes.

Next, an actinic ray is applied in a desired pattern. As the actinic ray, there can be used an X ray, an electron beam, a ultraviolet light, a visible light or the like; however, an actinic ray having a wavelength of 200 to 500 nm is particularly preferred. Use of an i-line stepper utilizing a wavelength of 365 nm or a g-line stepper utilizing a wavelength of 436 nm is more preferred in order to obtain a pattern of higher resolution.

Development with the aqueous alkaline solution of the present invention containing an anionic surfactant and an alkaline earth metal gives an excellent sensitivity and an excellent film-thinning ratio and further generates no scum. Therefore, by using the present aqueous alkaline solution in development of a photosensitive resin composition composed of a polyamide and a quinone diazide compound, a pattern of very high resolution can be formed.

BEST MODE FOR CARRYING OUT THE INVENTION

The present invention is specifically described below by way of Examples.

EXAMPLE 1

Synthesis of Polyamide 33.6 parts by weight (0.100 mole) of hexafluoro-2,2-bis (3-amino-4-hydroxyphenyl)propane was dissolved in 150 parts by weight of N,N-dimethyl-acetamide and 33.2 parts by weight (0.420 mole) of pyridine.

Then, thereto was dropwise added, at −10 to −15° C. over 30 minutes, 21.3 parts by weight (0.105 mole) of terephthalic acid chloride dissolved in 100 parts by weight of cyclohexanone. The mixture was then stirred at room temperature for 4 hours to complete a reaction. The reaction mixture was filtered. The filtrate was poured into water to precipitate an intended polymer (A). The precipitate was collected by filtration, thoroughly washed with water, and then dried under vacuum at 80° C. for 24 hours. The polymer (A) obtained had a polymerization degree of 150.

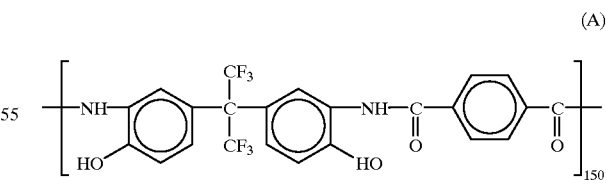

(A)

Production of Photosensitive Resin Composition 100 parts by weight of the polyamide (A) synthesized and 25 parts by weight of a diazoquinone (D) having the following structure were dissolved in 200 parts by weight of N-methyl-2-pyrrolidone (hereinafter referred to as NMP). The solution was filtered through a teflon filter of 0.2 μm to obtain a photosensitive resin composition.

(D)

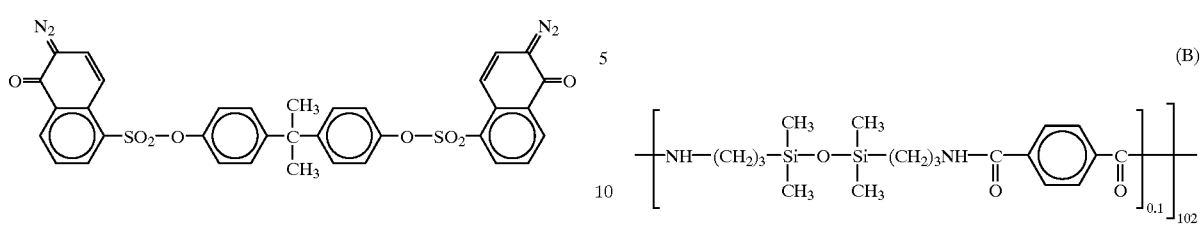

Evaluation of Photosensitivity

The photosensitive resin composition was spin-coated on a silicon wafer. The resulting material was heated on a hot plate at 120° C. for 3 minutes to evaporate the solvent and form a coating film of 5 μm in thickness. Onto this coating film was applied a light of 436 nm by 50 to 500 mJ/cm² from a g-line stepper through a reticle produced by TOPPAN PRINTING CO., LTD. (Test Chart No. 1: a left pattern and a removed pattern of 50 to 0.88 μm in width are drawn). The coating film was then developed, for 30 seconds by a paddle method, with a developing solution consisting of 1.20 parts by weight of tetramethylammonium hydroxide, 98.30 parts by weight of pure water, 0.50 part by weight of dodecylbenzenesulfonic acid and 0.00005 part by weight (0.5 ppm) of calcium acetate, to dissolve and remove the coating film of the exposed portions. Then, the remaining developing solution was washed away with water for 10 seconds. As a result, the portions exposed by 250 mJ/cm² or more were resolved down to 3 μm and a scum-free free pattern was obtained.

In the development, the film-thinning ratio [(decrease in thickness by development)÷(thickness before development)×100%; a smaller value is preferred] was good at 10%.

EXAMPLE 2

Synthesis of Polyamide

In 150 parts by weight of N,N-dimethyl-acetamide were dissolved 33.0 parts by weight (0.09 mole) of hexafluoro-2,2-bis(3-amino-4-hydroxyphenyl)-propane and 2.5 parts by weight (0.010 mole) of 1,3-bis (3-aminopropyl)-1,1,3,3-tetramethyldisiloxane.

Then, thereto was dropwise added, at −10 to −15° C. over 30 minutes, 21.3 parts by weight (0.105 mole) of terephthalic acid chloride dissolved in 100 parts by weight of cyclohexanone. The mixture was then stirred at room temperature for 4 hours to complete a reaction. The reaction mixture was filtered. The filtrate was poured into water to precipitate an intended polymer (B). The precipitate was collected by filtration, thoroughly washed with water, and then dried under vacuum at 80° C. for 24 hours. The polymer (B) obtained had a polymerization degree of 120.

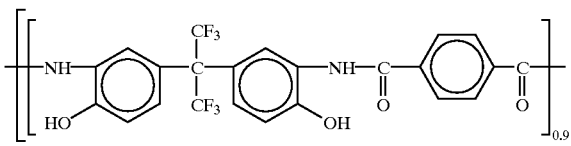

(B)

Production of Photosensitive Resin Composition 100 parts by weight of the polyamide (B) synthesized and 25 parts by weight of the diazoquinone (D) having the above structure were dissolved in 200 parts by weight of NMP. The solution was filtered through a teflon filter of 0.2 μm obtain a photosensitive resin composition.

Evaluation of Photosensitivity

Spin-coating, prebaking and light exposure were conducted under the same conditions as in Example 1. Then, development was made, for 60 seconds by a paddle method, with a developing solution consisting of 1.20 parts by weight of tetramethylammonium hydroxide, 93.80 parts by weight of pure water, 5.00 parts by weight of dodecylbenzene-sulfonic acid and 0.00005 part by weight (0.5 ppm) of calcium acetate, to dissolve and remove the coating film of the exposed portions. Then, the remaining developing solution was washed away with water for 10 seconds. As a result, the portions exposed by 300 mJ/cm² or more were resolved down to 5 μm and a scum-free pattern was obtained. In this case, the film-thinning ratio was good at 8%.

EXAMPLE 3

Synthesis of Polyamic Acid

In 400 parts by weight of NMP were dissolved 43.6 parts by weight (0.175 mole) of 1,3-(bis(γ-aminopropyl)-1,1,3,3-tetramethyldisiloxane and 57.5 parts by weight (0.178 mole) of benzophenonetetra carboxylic acid dianhydride. The solution was stirred at room temperature for 7 hours. The reaction solution was poured into water to obtain a precipitate. The precipitate was vacuum-dried at 80° C. to obtain a polyamic acid (C) having the following structure.

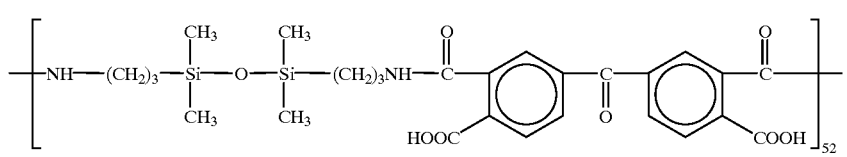

(C)

Production of Photosensitive Resin Composition 50 parts by weight of the polyamide (A) obtained in Example 1 and 50 parts by weight of the polyamic acid (C) were mixed with 30 parts by weight of the quinone diazide (D) and they were made into a solution. The solution was filtered through a teflon filter of 0.2 μm to obtain a photosensitive resin composition.

Evaluation of Photosensitivity

Spin-coating, prebaking and light exposure were conducted under the same conditions as in Example 1. Then, development was made, for 20 seconds by a paddle method, with a developing solution consisting of 1.20 parts by weight of tetramethylammonium hydroxide, 98.50 parts by weight of pure water, 0.30 part by weight of dodecylbenzenesulfonic acid and 0.00003 part by weight (0.3 ppm) of strontium chloride, to dissolve and remove the coating film of the exposed portions. Then, the remaining developing solution was washed away with water for 10 seconds. As a result, the portions exposed by 230 mJ/cm$^2$ or more were resolved down to 2 μm and a scum-free pattern was obtained. In this case, the film-thinning ratio was good at 13%.

EXAMPLE 4

Using a quinone diazide (E) having the following structure in place of the quinone diazide (D) of Example 1, the same evaluation as in Example 1 was made. As a result, the portions exposed by 280 mJ/cm$^2$ or more were resolved down to 3 μm and a scum-free pattern was obtained. In this case, the film-thinning ratio was good at 9%.

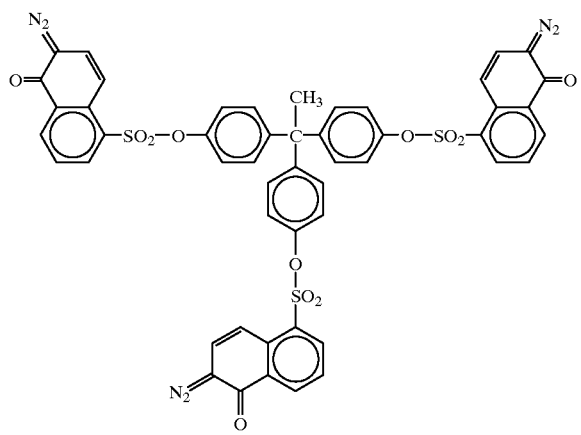

(E)

EXAMPLE 5

Using 0.00002 part by weight (0.2 ppm) of barium chloride in place of the calcium acetate of Example 1, the same evaluation as in Example 1 was made. As a result, the portions exposed by 210 mJ/cm$^2$ or more were resolved down to 2 μm and a scum-free pattern was obtained. In this case, the film-thinning ratio was good at 15%.

EXAMPLE 6

The amount of calcium acetate in Example 1 was changed to 0.00009 part by weight (0.9 ppm), and the same evaluation as in Example 1 was made. As a result, the portions exposed by 350 mJ/cm$^2$ or more were resolved down to 5 μm and a scum-free pattern was obtained. In this case, the film-thinning ratio was good at 8%.

Comparative Example 1

The developing solution of Example 1 was changed to a developing solution consisting only of 1.20 parts by weight of tetramethylammonium hydroxide, 98.80 parts by weight of pure water and 0.00003 part by weight (0.3 ppm) of calcium acetate and containing no dodecylbenzenesulfonic acid; and the same evaluation as in Example 1 was made.

Comparative Example 2

The developing solution of Example 2 was changed to a developing solution consisting only of 2.00 parts by weight of tetramethylammonium hydroxide, 98.00 parts by weight of pure water and 0.00003 part by weight (0.3 ppm) of calcium acetate and containing no dodecylbenzenesulfonic acid; and the same evaluation as in Example 2 was made.

Comparative Example 3

The developing solution of Example 1 was changed to a developing solution consisting of 1.20 parts by weight of tetramethylammonium hydroxide, 86.80 parts by weight of pure water, 12.00 parts by weight of dodecylbenzenesulfonic acid and 0.00003 part by weight (0.3 ppm) of calcium acetate; and the same evaluation as in Example 1 was made.

Comparative Example 4

In Example 1, the polyamide (A) was changed to the polyamide (B), the diazoquinone (D) was changed to the diazoquinone (E), and the developing solution was changed to a developing solution consisting of 1.20 parts by weight of tetramethylammonium hydroxide, 98.75 parts by weight of pure water, 0.05 part by weight of dodecylbenzenesulfonic acid and 0.00005 part by weight (0.5 ppm) of calcium acetate; and the same evaluation as in Example 1 was made.

Comparative Example 5

The developing solution of Example 1 was changed to a developing solution consisting only of 1.20 parts by weight of tetramethylammonium hydroxide, 98.30 parts by weight of pure water and 0.5 part by weight of dodecylbenzenesulfonic acid and containing no alkaline earth metal; and the same evaluation as in Example 1 was made.

Comparative Example 6

The developing solution of Example 1 was changed to a developing solution consisting of 1.20 parts by weight of tetramethylammonium hydroxide, 98.30 parts by weight of pure water, 0.5 part by weight of dodecylbenzenesulfonic acid and 0.001 part by weight (10 ppm) of calcium acetate; and the same evaluation as in Example 1 was made.

The results of Examples and Comparative Examples are shown in Table 1.

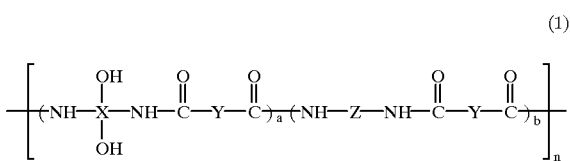

(1)

TABLE 1

|  | Alkali-soluble polymer | Photo-sensitive agent | Anionic surfactant | Addition amount of alkaline earth metal compound (ppm) | Presence of scum after development | Resolution ($\mu$m) | Film thinning (%) | Sensitivity (mJ/cm$^2$) |
|---|---|---|---|---|---|---|---|---|
| Example 1 | A | D | 0.5 wt. % | Ca 0.5 | No | 3 | 10 | 250 |
| Example 2 | B | D | 5.0 wt. % | Ca 0.5 | No | 5 | 8 | 300 |
| Example 3 | A/C = 50/50 | D | 0.3 wt. % | Sr 0.3 | No | 2 | 13 | 230 |
| Example 4 | A | E | 0.5 wt. % | Ca 0.5 | No | 3 | 9 | 280 |
| Example 5 | A | D | 0.5 wt. % | Ba 0.2 | No | 2 | 15 | 210 |
| Example 6 | A | D | 0.5 wt. % | Ca 0.9 | No | 5 | 8 | 350 |
| Comparative Example 1 | A | D | Not used | Ca 0.3 | Yes | 10 | 9 | 280 |
| Comparative Example 2 | B | D | Not used | Ca 0.3 | Yes | 15 | 7 | 310 |
| Comparative Example 3 | A | D | 12 wt. % | Ca 0.3 | No | 5 | 6 | 660 |
| Comparative Example 4 | B | E | 0.05 wt. % | Ca 0.5 | Yes | 12 | 10 | 280 |
| Comparative Example 5 | A | D | 0.5 wt. % | Not used | No | 5 | 33 | 180 |
| Comparative Example 6 | A | D | 0.5 wt. % | Ca 10 | No | 20 | 5 | 680 |

INDUSTRIAL APPLICABILITY

The present invention relates to a developing solution which can form a scum-free pattern at a high resolution and at a high residual film ratio in development of a photosensitive resin, particularly a positive photosensitive resin. Therefore, the present invention can be used, for example, in circuit formation in semiconductor device production, or in production of a printed circuit board.

What is claimed is:

1. An aqueous alkaline solution containing an alkylbenzenesulfonic acid and at least one kind of compound selected from compounds of calcium, strontium and barium, wherein the content of the alkylbenzene-sulfonic acid in the total aqueous alkaline solution is 0.1 to 10% by weight, and wherein the content of the total metals of the at least one kind of compound selected from compounds of calcium, strontium and barium is 0.1 to 1 ppm relative to the total aqueous alkaline solution.

2. A method for forming a pattern of a photosensitive resin composition, which comprises coating, on a substrate or the like, a positive photosensitive resin composition composed of a polyamide represented by the following formula (1):

wherein X is a tetravalent aromatic group; Y is a bivalent aromatic group; and Z is

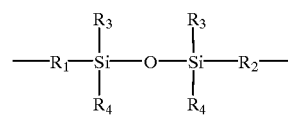

$R_1$ and $R_2$ are each a bivalent organic group, and $R_3$ and $R_4$ are each a monovalent organic group); a and b are each a mole fraction with the proviso that a+b=100 mole %, a=60.0 to 100 mole %, and b=0 to 40.0%; and n=2 to 500, and a diazoquinone compound, subjecting the resulting material to prebaking and then to light exposure, and dissolving and removing the exposed portions of the material with an aqueous alkaline solution containing an alkylbenzene-sulfonic acid and at least one kind of compound selected from compounds of calcium, strontium and barium, to obtain a pattern, wherein the content of the alkylbenzene-sulfonic acid in the total aqueous alkaline solution is 0.1 to 10% by weight, and wherein the content of the total metals of the at least one kind of compound selected from compounds of calcium, strontium and barium is 0.1 to 1 ppm relative to the total aqueous alkaline solution.

* * * * *